(12) United States Patent
Ishibashi et al.

(10) Patent No.: US 7,115,863 B1
(45) Date of Patent: Oct. 3, 2006

(54) PROBE FOR SCANNING PROBE LITHOGRAPHY AND MAKING METHOD THEREOF

(75) Inventors: Masayoshi Ishibashi, Hatoyama (JP); Tomihiro Hashizume, Hatoyama (JP); Hiroshi Kajiyama, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/616,076

(22) Filed: Jul. 13, 2000

(30) Foreign Application Priority Data

Aug. 27, 1999 (JP) ................................. 11-241330

(51) Int. Cl.
*H01J 37/00* (2006.01)
(52) U.S. Cl. .................................... 250/306; 250/492.2
(58) Field of Classification Search ................ 250/306, 250/307, 492.2, 423 F; 73/105; 438/100; 324/754, 762
See application file for complete search history.

(56) References Cited

U.S. PATENT DOCUMENTS

| | | | | |
|---|---|---|---|---|
| 5,245,187 A | * | 9/1993 | Kawase et al. | 250/306 |
| 5,360,978 A | * | 11/1994 | Gueret | 250/306 |
| 5,537,863 A | * | 7/1996 | Fujiu et al. | 73/105 |
| 5,886,922 A | * | 3/1999 | Saito et al. | 365/164 |
| 5,936,237 A | * | 8/1999 | van der Weide | 250/234 |
| 6,014,032 A | * | 1/2000 | Maddix et al. | 324/762 |
| 6,079,255 A | * | 6/2000 | Binnig et al. | 73/105 |
| 6,088,320 A | * | 7/2000 | Bayer et al. | 369/101 |
| 6,232,143 B1 | * | 5/2001 | Maddix et al. | 438/100 |

FOREIGN PATENT DOCUMENTS

| | | |
|---|---|---|
| JP | 08/054403 | 2/1996 |
| JP | 08-129875 | 5/1996 |
| JP | 09/251947 | 9/1997 |
| JP | 11-73906 | 3/1999 |
| JP | 11-094863 | 4/1999 |

OTHER PUBLICATIONS

M.A. McCord et al, "Lithography with the Scanning Tunneling Microscope", Journal of Vacuum Science and Technology, vol. B4, No. 1, Jan./Feb. 1986, pp. 86-88.

M.A. McCord et al, "Lift-Off Metallization Using Poly (Methylmethacrylate) Exposed with a Scanning Tunneling Microscope", Journal of Vacuum Science and Technology, vol. B6, No. 1, Jan./Feb. 1988, pp. 293-296.

A. Majumdar et al, "Nanometer-Scale Lithography Using the Atomic Force Microscope", Applied Physics Letters, vol. 61, No. 19, Nov. 1992, pp. 2293-2295.

K. Wilder et al, "Hybrid Atomic Force/Scanning Tunneling Lithography", Journal of Vacuum Science and Technology, vol. B15, No. 5, Sep./Oct. 1997, pp. 1811-1817.

M. Ishibashi et al, "Characteristics of Nanoscale Lithography Using AFM with a Current-Controlled Exposure System", Japanese Journal of Applied Physics, vol. 37, 1998, pp. 1565-1569.

(Continued)

*Primary Examiner*—Kiet T. Nguyen
(74) *Attorney, Agent, or Firm*—Mattingly, Stanger, Malur & Brundidge, P.C.

(57) ABSTRACT

A probe of scanning probe lithography which provides a long time of useful life. The probe has a tip part comprising a conductor and an insulator, the insulator is formed to cover the conductor, and the conductor is formed to provide a substantially uniform cross-sectional configuration with respect to a surface to be patterned through scanning.

11 Claims, 9 Drawing Sheets

OTHER PUBLICATIONS

T.R. Albrecht et al, "Microfabrication of Cantilever Styli for the Atomic Force Microscope", Journal of Vacuum Science and Technology, vol. A8, No. 4, Jul./Aug. 1990, pp. 3386-3396.

S. Iijima, "Helical Microtubles of Graphitic Carbon", NATURE, vol. 354, Nov. 7, 1991, pp. 56-59.

H. Dai et al, "Nanotubes as Nanoprobes in Scanning Probe Microscopy", NATURE, vol. 384, Nov. 14, 1996, pp. 147-150.

* cited by examiner

PROBE FOR SCANNING PROBE LITHOGRAPHY AND MAKING METHOD THEREOF

BACKGROUND OF THE INVENTION

The present invention relates to a probe for scanning probe lithography and a making method thereof.

As an integration scale of semiconductor devices and a density level of recording media have increased, it has been required to provide an advanced technique for microstructure fabrication thereof. At present, in photolithography process for production of common semiconductor devices, a minimum fabrication dimension is limited to approximately 100 nm due to characteristics of an optical wavelength of a light source and a material of a lens used in photolithography equipment. Further, in laser process for production of masters of recording media, a minimum fabrication dimension is approximately 200 nm, which might cause a decrease in margin of resolution.

In recent years, particular attention has been focused upon a microstructure fabrication technique based on scanning probe microscopy to be employed in lieu of the conventional art mentioned above, e.g., this technique is found in Journal of Vacuum Science Technology B4 (1986), pp. 86–88, reported by M. A. McCord et al. In the microstructure fabrication technique based on scanning probe microscopy, a voltage is applied between a probe and a substrate for forming microstructure patterns, and extremely high resolution is attainable to allow atomic-level or nanostructure fabrication in principle. In Journal of Vacuum Science Technology B6 (1988), pp. 293–296, reported by M. A. McCord et al., and in Applied Physics Letter 61 (1992) pp. 2293–2295, reported by A. Majumdar et al., there is disclosed a microfabrication process method of scanning probe lithography in which patterns are formed using a resist film as in conventional lithography. Since a well-established pattern transfer method for transferring patterns from a resist film to a substrate, which has been developed for the conventional lithography, is applicable to the scanning probe lithography, it is expected that the scanning probe lithography will find widespread use in practice of the next generation of microfabrication. In particular, a scanning probe lithography technique in which a micro-cantilever type of probe designed for an atomic force microscope is used and the exposure is controlled by varying a voltage for keeping a constant current flowing, as proposed by K. Wilder et al. in Journal of Vacuum Science Technology B15 (1997), pp. 1811–1817, has received considerable attention because of its advantageous controllability and reproducibility of uniform pattern linewidths.

SUMMARY OF THE INVENTION

In the above-mentioned scanning probe lithography technique, though high resolution can be attained, the useful life of the probe is rather short, i.e., it is not allowed to draw a large number of microstructure patterns with a single probe. More specifically, in the known scanning probe lithography technique, the probe for atomic force microscopy which is coated with a metallic material such as gold, reported by A. Majumdar et al. in Applied Physics Letter 61 (1992) pp. 2293–2295, or titanium is used. Therefore, in practice of lithographic patterning, the tip of the probe is likely to be deformed or the metallic material coated thereon is apt to be peeled off due to wear or collision with an obstacle, not permitting the drawing of a large number of microstructure patterns.

In view of the foregoing, it is an object of the present invention to provide a probe for scanning probe lithography which is capable of drawing a large number of microstructure patterns and a method of making the same.

In accomplishing this object of the present invention and according to one aspect thereof, there is provided a probe for scanning probe lithography, in which a tip part is so structured that a part of a conductor thereof is covered with an insulator for increasing mechanical strength of the conductor and the conductor is so formed as to have a fine and substantially uniform cross-sectional configuration perpendicular to a surface to be patterned through scanning. Thus, a fine pattern can be drawn since the tip apex part of the conductor has a fine shape, and the fine conductor covered with the insulator is resistant to breakage. Further, even after the tip of the probe wears to some extent due to abrasive contact with a resist film, the cross-sectional configuration of the conductor which is brought into contact with the surface of the resist film remains unchanged, thereby making it possible to keep a pattern width substantially constant. Resultantly, the useful life of the probe of the present invention is far longer than that of the known probe. According to the present invention, it becomes possible to draw a large number of microstructure patterns with a single probe.

The above and other objects, features and advantages of the present invention will become more apparent from the following detailed description with reference to the accompanying drawings.

BRIEF DESCRIPTION OF THE DRAWINGS

FIGS. 1($a$) and 1($b$) are conceptual schemes for explaining advantageous effects of a preferred embodiment of a probe for scanning probe lithography according to the present invention;

FIGS. 2($a$) to 2($h$) are schematic diagrams showing a procedure for making a lithographic scanning probe according to the present invention;

FIGS. 3($a$) and 3($b$) are plan views of two examples of spring sections for the lithographic scanning probe in FIG. 2($h$), as seen from a surface to be patterned;

FIG. 4($a$) is a plan view of a spring section and a tip part having a hemispherical shape in another preferred embodiment of a lithographic scanning probe according to the present invention, as seen from a surface to be patterned;

FIG. 4($b$) is a sectional view taken on line A—A of FIG. 4($a$);

FIG. 5($a$) is a plan view of a tip part with a conductor having a different structure in another preferred embodiment of a lithographic scanning probe according to the present invention, as seen from a surface to be patterned;

FIG. 5($b$) is a sectional view taken on line A—A of FIG. 5($a$);

FIG. 5($c$) is a sectional view taken on line B—B of FIG. 5($a$);

FIG. 7($a$) is a plan view of a tip part having a different structure in another preferred embodiment of a lithographic scanning probe according to the present invention, as seen from a surface to be patterned;

DESCRIPTION OF THE PREFERRED EMBODIMENTS

Figure 1A:
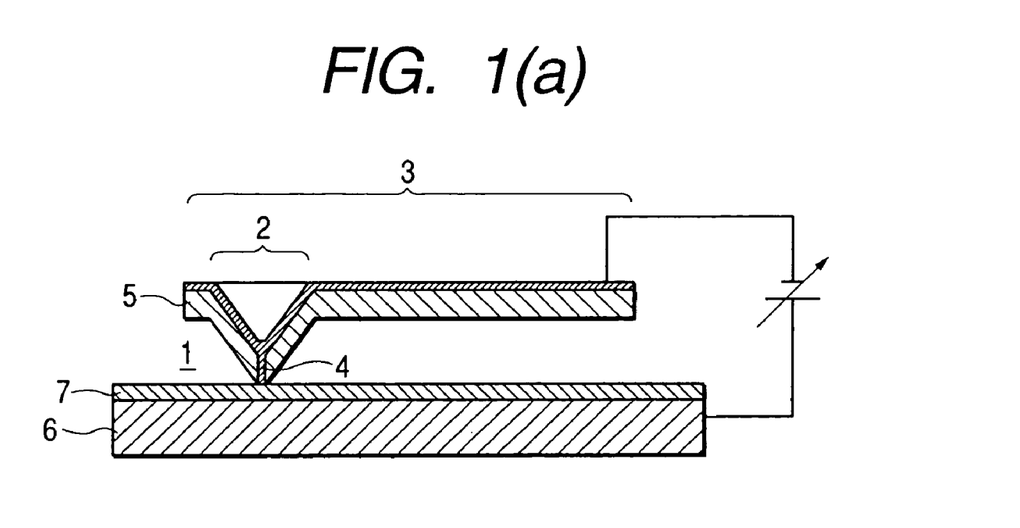
Figure 1B:
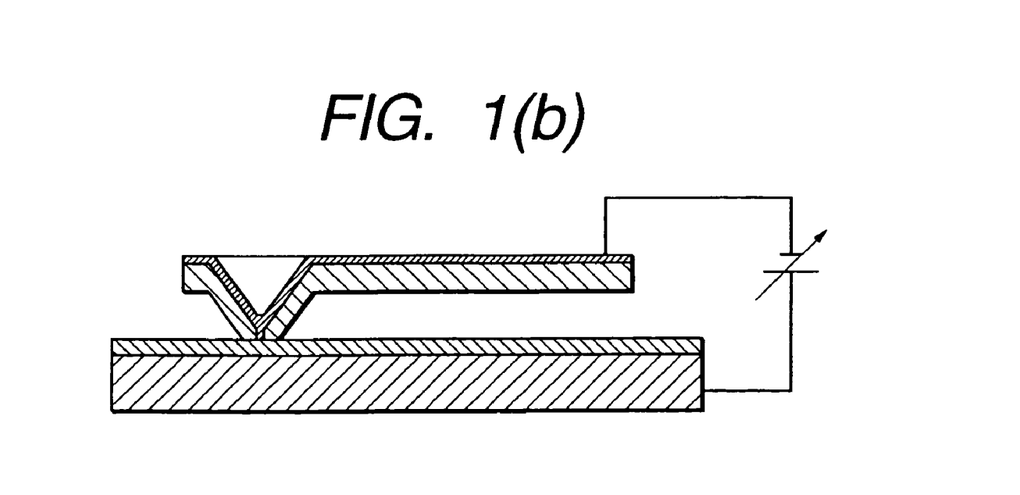

With reference to FIGS. 1(a) and 1(b), the outline of a probe for scanning probe lithography according to the present invention is described below.

Referring to FIG. 1(a), there is shown a sectional view for explaining a patterning operation using a lithographic scanning probe in a preferred embodiment of the present invention. In a scanning probe lithography system, such as is found in Japan Journal of Applied Physics 37 (1998), pp. 1565–1569, reported by M. Ishibashi et al., a lithographic scanning probe 1 of the present invention is usable for drawing patterns on a resist film 7 coated on a substrate 6. The lithographic scanning probe 1 comprises a tip part 2 and a spring section 3. The tip part 2 includes a conductor 4 (indicated as a shaded part in FIG. 1(a)) and an insulator 5, the tip apex part of the conductor 4 is formed in a fine needle shape which has a substantially uniform cross-sectional configuration with respect to the resist film 7 to be patterned, and the insulator 5 is formed to cover the periphery of the tip apex part of the conductor 4. That is to say, in a fashion analogous to a lead in a pencil, the conductor 4 has the same thickness in the longitudinal direction thereof, and the periphery of the conductor 4 is covered with the insulator 5 to provide mechanical strength; the conductor 4 and the insulator 5 are analogous to a lead part and a wooden part of a pencil, respectively. Since the tip apex part of the conductor 4 has a fine needle shape, it is possible to draw a fine pattern, and the conductor 4 covered with the insulator 5 is resistant to breakage during scanning operation. Further, even after the tip part 2 wears to some extent through operation of drawing a multiplicity of patterns, the cross-sectional configuration of the needle-like tip apex part of the conductor 4 remains intact with respect to the resist film 7 as shown in FIG. 1(b). Thus, with the lithographic scanning probe 1 of the present invention, it is allowed to draw a number of fine patterns in succession.

The present invention will now be described in detail by way of example with reference to the accompanying drawings.

Embodiment I

In the present preferred embodiment, a lithographic scanning probe comprises a spring section and a tip part in a structure similar to a conventional probe for atomic force microscopy, and the spring section is structured in a micro-cantilever form. Arranged as mentioned above, the lithographic scanning probe is applicable to scanning probe lithography systems such as those proposed in Journal of Vacuum Science Technology B15 (1997), pp. 1811–1817, reported by K. Wilder et al., Japan Journal of Applied Physics 37 (1998), pp. 1565–1569, reported by M. Ishibashi et al., and Japanese Unexamined Patent Publication No. 11 (1999)-73906.

As to fabrication of a micro-cantilever type of probe for atomic force microscopy, there are known a micro-casting method, reported by T. R. Albrecht et al. in Journal of Vacuum Science Technology A8 (1990), pp. 3386–3396), an isotropic reactive ion etching method, a lift-off—evaporation combination method, etc. In the present preferred embodiment, a lithographic scanning probe is fabricated utilizing the micro-casting method. In the micro-casting method, a mold for a probe is formed on a silicon substrate, films are layered, and then the silicon substrate used for molding is dissolved to attain a probe.

Figure 2A:
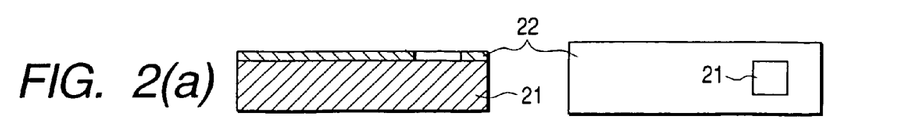
Figure 2B:
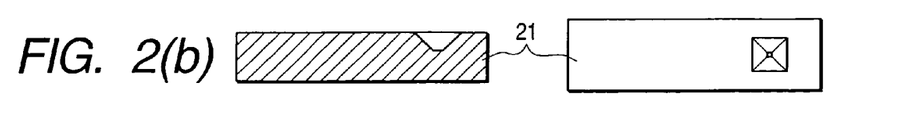
Figure 2C:
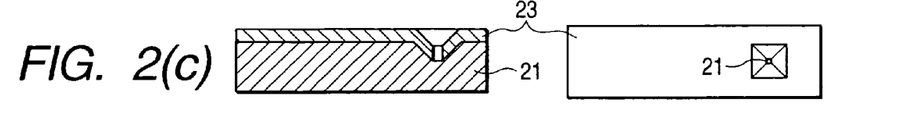
Figure 2D:
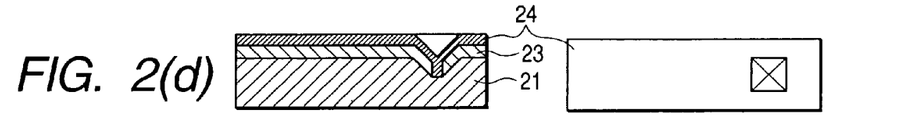
Figure 2E:
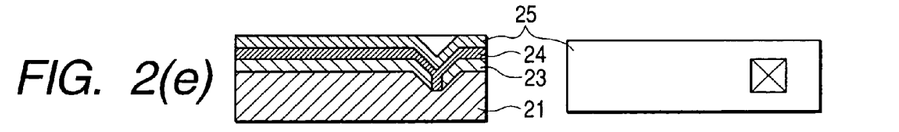
Figure 2F:
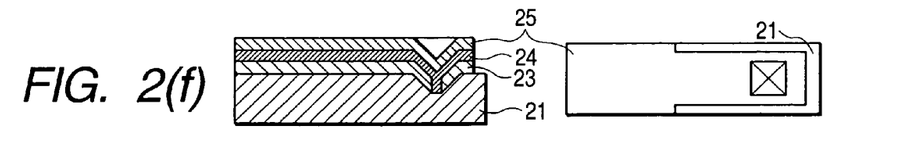
Figure 2G:
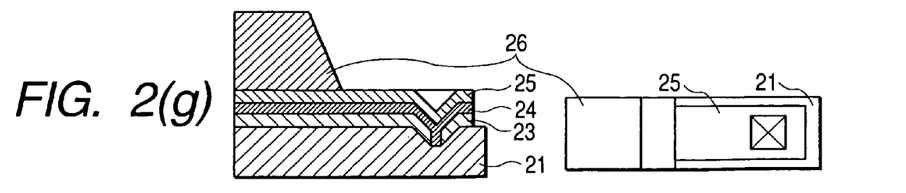
Figure 2H:
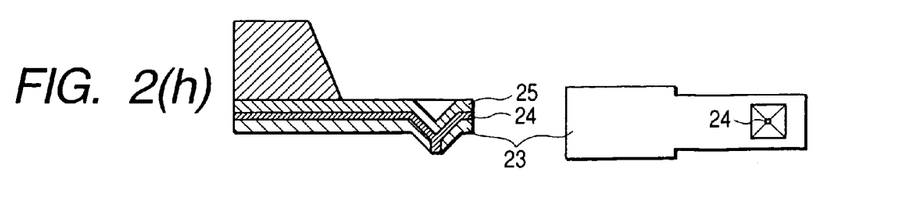

Referring to FIGS. 2(a) to 2(h), there are shown schematic diagrams indicating process steps for making a lithographic scanning probe in the present preferred embodiment. On the left side of FIG. 2, sectional views of structures at respective process steps are shown. On the right side thereof, plan views are shown in FIGS. 2(a) to 2(g), and a bottom view is shown in FIG. 2(h).

On a 0.4 mm-thick silicon substrate 21 having a crystal orientation (100), a hard-mask layer 22 of silicon dioxide having a thickness of 100 nm is formed, and then a hole pattern of 4000 nm square is made on the hard-mask layer 22 by photolithography and reactive ion etching (FIG. 2(a)).

Using the hard-mask layer 22 thus patterned, an inverted quadrangular pyramid hole having a flat bottom is etched anisotropically with an aqueous solution of potassium hydroxide, and then the hard-mask layer 22 is removed with hydrofluoric acid (FIG. 2(b)). In silicon etching with an aqueous solution of potassium hydroxide, an etching rate varies with a crystal orientation. Where a silicon substrate having a crystal orientation (100) is used, an inverted quadrangular pyramid shape is formed as shown in FIG. 2(b) since an etching rate on a (111) crystal plane is relatively slow. In the present preferred embodiment, an etching time is adjusted so that a flat area 50 nm square will be left at the bottom of the hole. Thus, an inverted quadrangular pyramid shape 2750 nm deep, with a flat bottom 50 nm square, is formed. This part is to be used as a mold pattern for fabricating the tip part.

After removal of the hard-mask layer 22, an insulating layer 23 of silicon nitride having a thickness of 200 nm is formed on the silicon substrate 21. Then, at the center of the inverted quadrangular pyramid hole, i.e., at the flat bottom thereof, a cylindrical pit having a diameter of 50 nm is opened by electron beam lithography and reactive ion etching (FIG. 2(c)). While silicon nitride is used to form the insulating layer 23 in the present preferred embodiment, it is also preferable to use a hard insulating material such as silicon dioxide or diamond.

After the cylindrical pit having a diameter of 50 nm is opened at the center of the inverted quadrangular pyramid hole, a conductive layer 24 of titanium having a thickness of 250 nm is deposited over the entire surface of the insulating layer 23, and also a part of the conductive layer 24 is embedded into the cylindrical pit having a diameter of 50 nm by evaporation (FIG. 2(d)). While titanium is used to form the conductive layer 24 in the present preferred embodiment, it is also preferable to use such a conductive material as tungsten, molybdenum, chromium, titanium carbide, tungsten carbide, molybdenum carbide, titanium nitride, tungsten nitride, molybdenum nitride, or conductive diamond. Further, while evaporation is performed for embedding a part of the conductive layer 24 into the cylindrical pit corresponding to a tip apex to be fabricated in the present preferred embodiment, it is also practicable to perform plating instead of evaporation. Note, however, that a thin film of a metallic material such as gold or copper to be used as an electrode must be provided under the insulating layer 23 when plating is performed.

After formation of the conductive layer 24, a vending-correction layer 25 of silicon nitride having a thickness of 200 nm is formed on the conductive layer 24 (FIG. 2(e)). The vending-correction layer 25 serves as a layer for preventing the spring section from warping due to a stress to be applied between the insulating layer 23 and the conductive layer 24 when the substrate 21 is dissolved and removed at the last process step. Depending on materials selected for the insulating layer 23 and the conductive layer 24, a degree of possible warping of the spring section may become insignificant. In this case, it is practicable to skip over the process step of forming the vending-correction layer 25.

After formation of the vending-correction layer 25, the configuration of the spring section, which is formed of the insulating layer 23, conductive layer 24 and vending-correction layer 25 on the silicon substrate 21, and the configuration of a holder joint part are processed by photolithography and reactive ion etching (FIG. 2(f)). Through the process steps shown in FIGS. 2(a) to 2(h), the spring section is configured to have a simple plate spring shape. In this case, a fine cantilever having a rectangular shape 0.01 mm wide and 0.1 mm long can be formed, for example.

After the insulating layer 23, conductive layer 24 and vending-correction layer 25 are arranged to provide a shape of cantilever, a holder 26 is formed at the base of the cantilever (FIG. 2(g)). As the holder 26, a glass part which is 0.3 mm thick, 2 mm wide and 4 mm long is attached to the base of the cantilever, for example. In the present preferred embodiment, anode coupling is used for adhesion between the spring section and the holder 26. Instead, adhesion therebetween may also be made using a photoactive or thermosetting joining material, such as an epoxy adhesive.

After adhesion between the spring section and the holder 26, the silicon substrate 21 is dissolved away with an aqueous solution of potassium hydroxide in the last process step to attain the lithographic scanning probe of the present invention (FIG. 2(h)).

On the right side of FIG. 2(h), there is shown a bottom view of the lithographic scanning probe thus attained (as seen from a surface to be patterned). At the apex part of the lithographic scanning probe, a quadrangular pyramid shape including the insulating layer 23 is provided, and a tip apex formed of the conductive layer 24, just like a lead in a pencil, is provided at the center of the quadrangular pyramid shape.

Figure 3A:
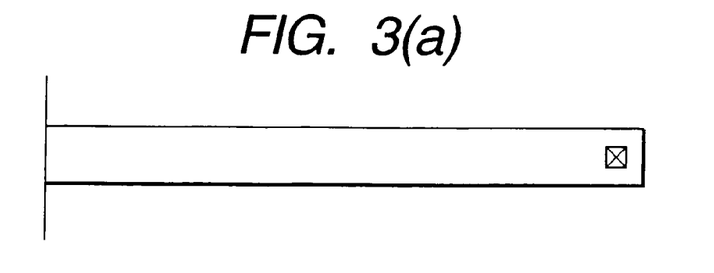
Figure 3B:
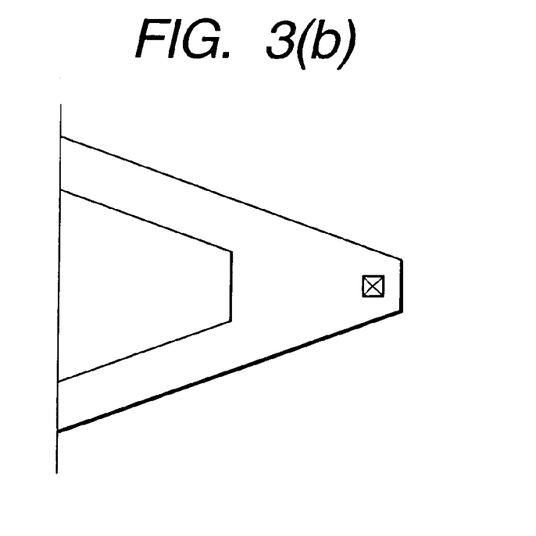

Referring to FIGS. 3(a) and 3(b), there are shown two examples of cantilever configurations, as seen from a surface to be patterned. FIG. 3(a) shows a simple plate spring type of cantilever having a tip part at its end. FIG. 3(b) shows a cantilever which is formed by cutting out a base part of a triangular plate spring into a trapezoidal shape for decreasing a spring constant. In this example, a tip part is also formed at the end of the cantilever.

EMBODIMENT II

Figure 4A:
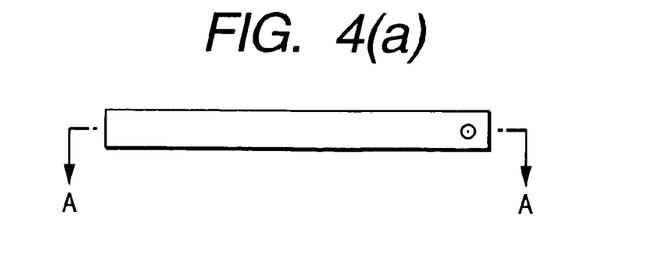
Figure 4B:
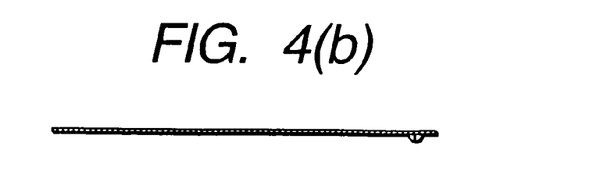

While the tip part having a quadrangular pyramid shape with a flat apex is formed in the preferred embodiment described above in connection with FIGS. 2(a) to 2(h), it is also preferable to form a tip part having a hemispherical shape. Referring to FIGS. 4(a) and 4(b), there are shown a spring section and a tip part formed in a hemispherical shape having a diameter of 4000 nm in another preferred embodiment of a lithographic scanning probe. FIG. 4(a) is a plan view of the lithographic scanning probe according to the present preferred embodiment as seen from a surface to be patterned, and FIG. 4(b) is a sectional view taken on line A—A of FIG. 4(a). For fabricating the hemispherical tip part shown in FIG. 4, a hemispherical hole therefor is formed on the silicon substrate 21. Instead of anisotropic etching with an aqueous solution of potassium hydroxide employed for forming the inverted quadrangular pyramid hole in the EMBODIMENT I, isotropic etching with a mixture solution of hydrofluoric acid, nitric acid and acetic acid is used for forming the hemispherical hole. The other steps of fabrication process in the present preferred embodiment are the same as those shown in FIGS. 2(a) to 2(h).

EMBODIMENT III

In the present preferred embodiment, there is provided a lithographic scanning probe in which a tip part thereof has a structure different from that in the EMBODIMENT I. The following describes the EMBODIMENT III with particular reference to FIGS. 5(a) to 5(c). In the EMBODIMENT III, the lithographic scanning probe has a three-layer structure comprising a conductive layer, an insulating layer and a vending-correction layer as in the EMBODIMENT I. A holder and a spring section of the lithographic scanning probe in the EMBODIMENT III are structured in the same fashion as in the EMBODIMENT I.

Figure 5A:
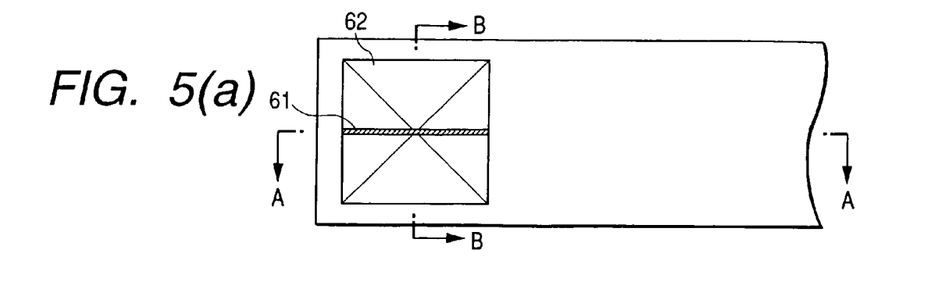
Figure 5B:
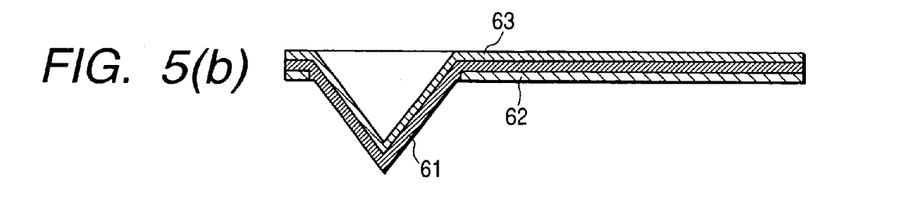
Figure 5C:
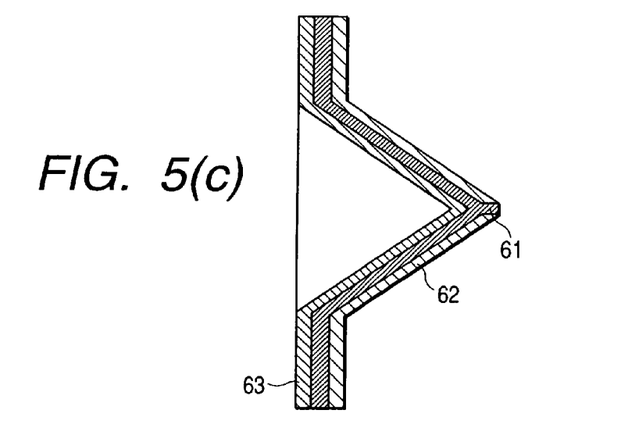

FIG. 5(a) shows a schematic diagram of the tip part in the EMBODIMENT III, as seen from a surface to be patterned, FIG. 5(b) is a sectional view taken on line A—A of FIG. 5(a) in the arrow direction, and FIG. 5(c) is a sectional view taken on line B—B of FIG. 5(a) in the arrow direction.

In the present preferred embodiment, it is assumed that the lithographic scanning probe moves in the direction of line A—A of FIG. 5(a) with respect to a surface to be patterned through scanning. The lithographic scanning probe of the present preferred embodiment comprises a conductor 61, an insulator 62, and a vending-correction layer 63. At the apex of the tip part having a quadrangular pyramid shape, which serves as a drawing point, the conductor 61 is covered with the insulator 62 in a fashion similar to FIG. 2(h) (FIG. 5(c)). Unlike the EMBODIMENT I, however, a band of the conductor 61 is exposed in the direction of scanning movement of the apex of the quadrangular pyramid tip part used as a drawing point (it is exposed in the direction of line A—A). Therefore, in the present preferred embodiment, the configuration of the tip apex of the conductor 61 is equivalent to a rectangle with respect to the direction of scanning movement of the tip. For example, a rectangle of 50 nm by 4000 nm is provided in the present preferred embodiment. According to the present preferred embodiment in which the configuration of the tip apex of the conductor 61 is rectangular with respect to the direction of scanning movement of the tip, in addition to an advantage that long length drawing is permitted as in the EMBODIMENT I, there is provided another advantage that any part of the rectangular face of the conductor 61 comes into contact with a surface to be patterned even when the apex of the quadrangular pyramid tip part is not positioned perpendicularly to a surface to be patterned due to undulations thereon. Thus, the operation of patterning can be performed with higher reliability.

Figure 6:
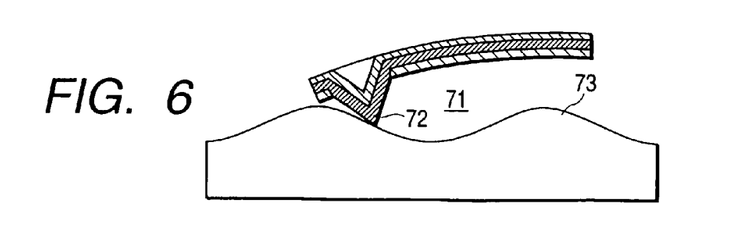
FIG. 6 is a conceptual scheme for explaining advantageous effects of the preferred embodiment of the lithographic scanning probe shown in FIG. 5.

FIG. 6 is a scheme for explaining the additional advantage mentioned above. Even if a tip part 71 inclines due to undulations on a surface to be patterned 73, any tip apex part of a conductor 72 is kept in contact with the surface to be patterned 73. Where microstructure patterns are drawn using the lithographic scanning probe of the present preferred embodiment, it will be apparent to those skilled in the art that scanning movement is limited in the direction perpendicular to the short side of the rectangular shape of the tip apex part of the conductor 72 (i.e., in the direction of line A—A in FIG. 5(a)).

While the tip part having a quadrangular pyramid shape is formed in the present preferred embodiment mentioned above, it is also practicable to form a tip part having a hemispherical shape as shown in FIG. 4.

The lithographic scanning probe of the present preferred embodiment can be fabricated through process steps similar to those shown in FIG. 2 for the EMBODIMENT I. While the cylindrical pit having a diameter of 50 nm is opened at the center of the inverted quadrangular pyramid hole at the process step shown in FIG. 2(c) in the EMBODIMENT I, a rectangular band of 50 nm by 4000 nm is formed in the longitudinal direction of the spring section in the present preferred embodiment.

EMBODIMENT IV

Figure 7A:
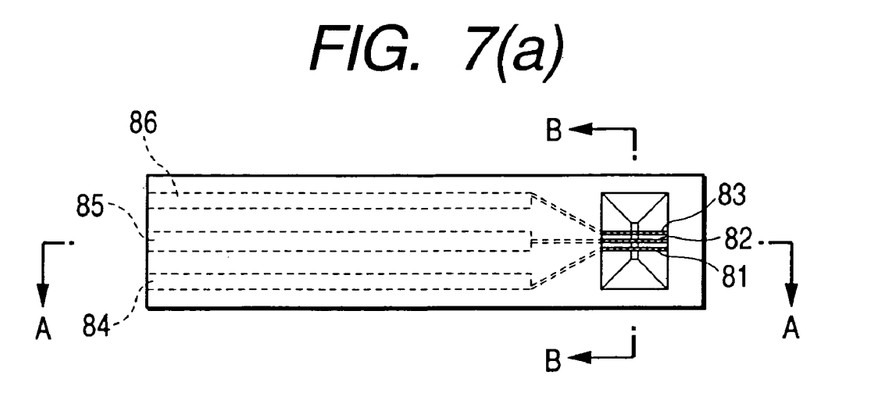
Figure 7B:
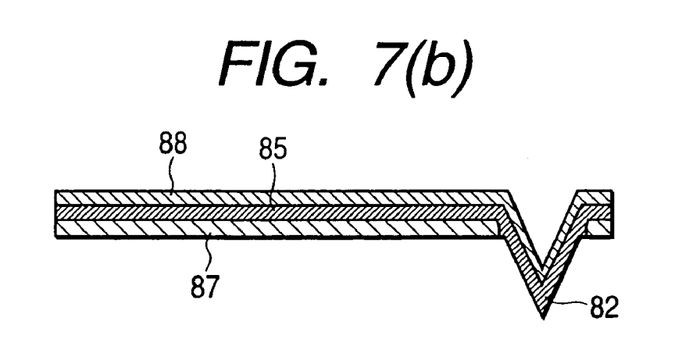
FIG. 7(b) is a sectional view taken on line A—A of FIG. 7(a)
Figure 7C:
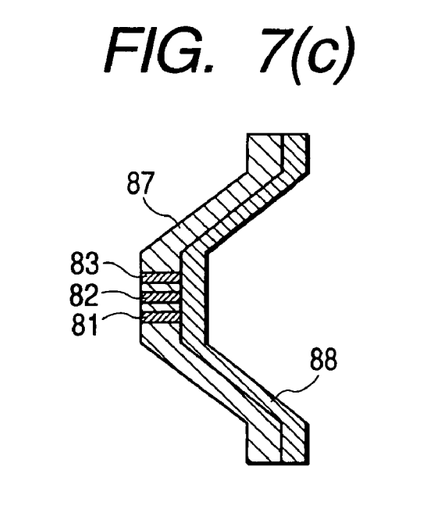
FIG. 7(c) is a sectional view taken on line B—B of FIG. 7(a)

In the EMBODIMENT IV, there is provided a lithographic scanning probe in which a tip part thereof has a plurality of conductors. A holder and a spring section of the lithographic scanning probe in the EMBODIMENT IV are structured in the same fashion as in the EMBODIMENT III. Referring to FIGS. 7(a) to 7(c), there are shown schematic diagrams of the structures of the tip part and the spring section in the present preferred embodiment. FIG. 7(a) is a plan view of the lithographic scanning probe as seen from a surface to be patterned, FIG. 7(b) is a sectional view taken on line A—A of FIG. 7(a) in the arrow direction, and FIG. 7(c) is a sectional view taken on line B—B of FIG. 7(a) in the arrow direction. In the present preferred embodiment, the tip part of the lithographic scanning probe comprises three independent conductors; a first conductor 81, a second conductor 82, and a third conductor 83. Correspondingly, the spring section thereof comprises three independent electrodes; a first electrode 84, a second electrode 85, and a third electrode 86. These conductors and electrodes are covered with an insulator 87 and a vending-correction layer 88.

Unlike the EMBODIMENT III in which the tip part has a single conductor, the present preferred embodiment is characterized in that the tip part comprises a plurality of conductors. Each tip apex of the first conductor 81, the second conductor 82 and the third conductor 83 in the present preferred embodiment has a rectangular shape of 50 nm by 4000 nm with respect to a surface to be patterned, and each conductor-to-conductor space is 20 nm. Since the tip part comprises a plurality of conductors, the spring section has a plurality of electrodes corresponding to them.

In principle, the lithographic scanning probe of the present preferred embodiment is fabricated through the same process steps as those in FIGS. 2(a) to 2(h). For forming the plural conductors in the tip part and the plural electrodes in the spring section, it is required to use a mask prepared therefor at a process step of conductive layer deposition corresponding to FIG. 2(d). Thus, independent insulated conductors and electrodes can be provided.

In practice of microstructure patterning, it is possible to draw pattern lines having different widths using a single lithographic scanning probe fabricated according to the present preferred embodiment. More specifically, for drawing a pattern line in a narrow width, one of the first to third conductors 81 to 83 is used. For drawing a pattern line in a wide width, all of the first to third conductors 81 to 83 are used. For drawing a pattern line in a medium width, the first and second conductors or the second and third conductors are used in a pair. As in the EMBODIMENT III, where microstructure patterns are drawn using the lithographic scanning probe of the present preferred embodiment, it will be apparent to those skilled in the art that scanning movement is limited in the direction perpendicular to the short side of the rectangular shape of the tip apex part of each conductor.

EMBODIMENT V

Referring to FIGS. 8(a) to 8(h), there is shown a lithographic scanning probe fabrication method which is different from that described in connection with FIGS. 2(a) to 2(h). As in the process steps indicated in FIGS. 2(a) and 2(b), on a 0.4 mm-thick silicon substrate 91 having a crystal orientation (100), an inverted quadrangular pyramid hole having a flat bottom 50 nm square is made in a depth of 2750 nm (FIG. 8(a)).

Figure 8A:
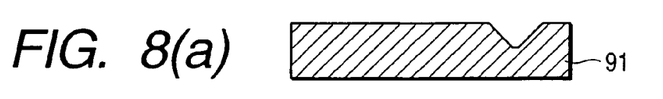
FIGS. 8(a) to 8(h) are schematic diagrams showing another procedure for making a lithographic scanning probe according to the present invention.
Figure 8B:
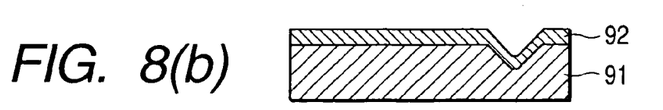

Then, on the silicon substrate 91 where the inverted quadrangular pyramid hole has been made as mentioned above, a hydrogenated carbon film 92 having a conductivity of 10 ohms•cm and a thickness of 300 nm is formed by chemical vapor deposition (FIG. 8(b)).

Figure 8C:
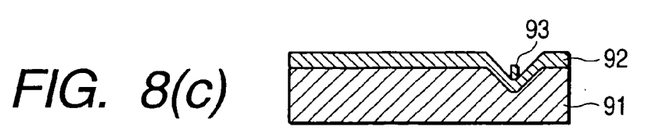

Further, a tungsten film having a thickness of 500 nm is formed as a hard-mask layer on the carbon hydride film 92. Then, by electron beam lithography and reactive ion etching, the hard-mask layer thus formed is processed to leave only a cylindrical hard-mask 93 having a diameter of 50 nm at the center (bottom) of the inverted quadrangular pyramid hole (FIG. 8(c)).

Figure 8D:
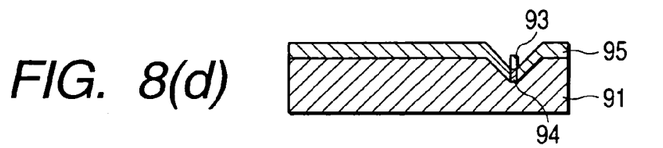

After the cylindrical hard-mask 93 having a diameter of 50 nm is formed at the center of the inverted quadrangular pyramid hole, the surface of the silicon substrate 91 is heated in vacuum at 600° C. for a period of 30 minutes by irradiating it with a high-energy X ray beam. In the present preferred embodiment, an X ray energy level is 4 keV, an X ray irradiation density is $1 \times 10^{21}$ photons/cm$^2$s, and an X ray irradiation time is one hour. As the result of high-energy X ray exposure, only a part located immediately below the hard-mask 93 remains intact as a conductive hydrogenated carbon part in the carbon hydride film 92, and the other parts therein are changed into insulating diamond parts. The conductive hydrogenated carbon part thus preserved intact is provided as a conductor 94, and the insulating diamond parts are provided as an insulator 95 (FIG. 8(d)).

Figure 8E:
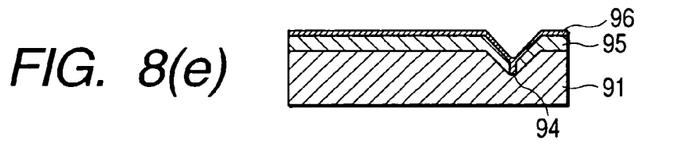

After formation of the conductor 94 and the insulator 95, the hard-mask 93 is removed, and an electrode layer 96 of titanium having a thickness of 20 nm is deposited over the insulator 95 (FIG. 8(e)).

Figure 8F:
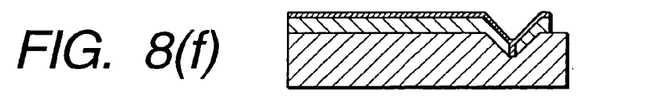
Figure 8G:
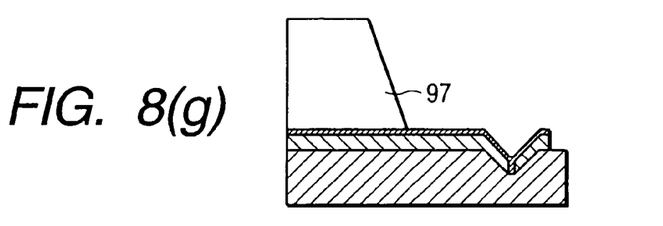
Figure 8H:
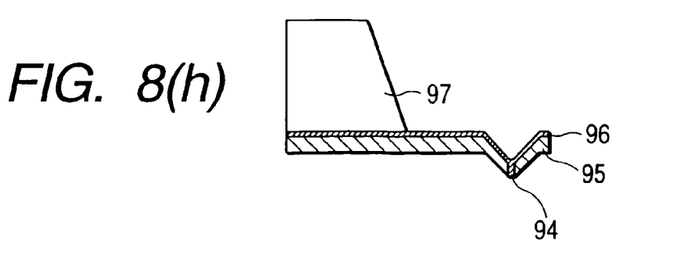

After deposition of the electrode layer 96, a cantilever comprising the insulator 95, the conductor 94 and the electrode layer 96 is formed on the silicon substrate 91 (FIG.

8(*f*)). The configuration of the cantilever in the x and y directions is the same as that in the EMBODIMENT I.

After forming the insulator 95, the conductor 94 and the electrode layer 96 into a cantilever shape on the silicon substrate 91, a holder 97 made of glass is secured to a spring section of the cantilever with an adhesive (FIG. 8(*g*)).

In the last process step after the holder 97 is secured to the spring section, the silicon substrate 91 is dissolved away with an aqueous solution of potassium hydroxide to attain the lithographic scanning probe of the present preferred embodiment (FIG. 8(*h*)).

In the present preferred embodiment, since the electrode layer 96 is formed of a titanium film as thin as 20 nm, it is practicable to skip over a process step of forming a vending-correction layer which would otherwise be required.

EMBODIMENT VI

Figure 9A:
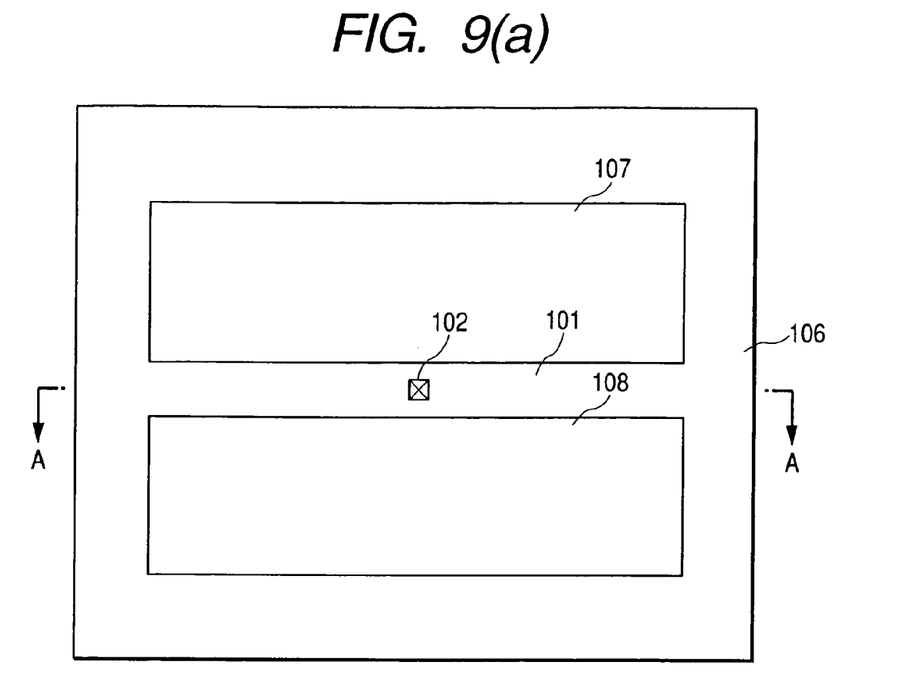
FIG. 9(a) is a plan view of a tip part and a spring section having a different structure in another preferred embodiment of a lithographic scanning probe according to the present invention, as seen from a surface to be patterned.
Figure 9B:
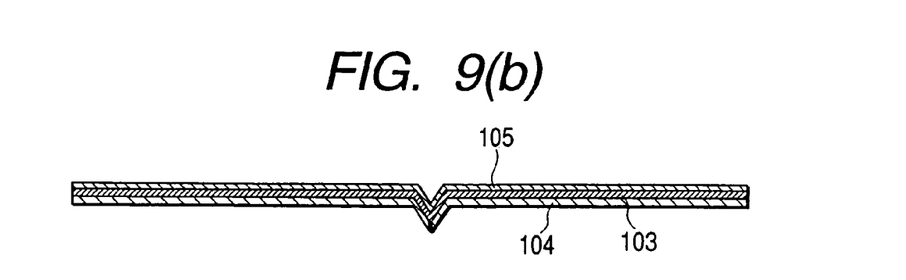
FIG. 9(b) is a sectional view taken on line A—A of FIG. 9.
Figure 9C:
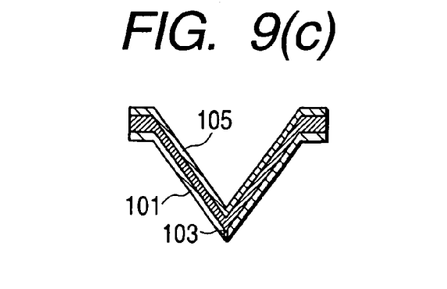
FIG. 9(c) is an enlarged view of the tip part of the lithographic scanning probe shown in FIG. 9(b)

In the EMBODIMENT VI, there is provided a lithographic scanning probe having a different configuration from those of the lithographic scanning probes described so far. While the spring sections in the foregoing preferred embodiments are of a cantilever type, the present preferred embodiment provides a spring section of a double-end-support type. Referring to FIGS. 9(*a*) to 9(*c*), there are shown schematic diagrams of the lithographic scanning probe according to the present preferred embodiment. FIG. 9(*a*) is a schematic diagram of the lithographic scanning probe as seen from a surface to be patterned, FIG. 9(*b*) is a sectional view taken on line A—A of FIG. 9(*a*) in the arrow direction, and FIG. 9(*c*) is an enlarged view of a tip part indicated in FIG. 9(*b*). In the present preferred embodiment, the lithographic scanning probe comprises a spring section 101 and a tip part 102. To attain the spring section 101 to be used as a double-end-support beam, windows 107 and 108 are cut out of a thin sheet 106. Thus, the spring section 101 of a double-end-support type is formed on the center of the thin sheet 106. Similarly to the lithographic scanning probe of a cantilever type described in each of the foregoing preferred embodiments, the tip part and the spring section comprise a conductor 103, an insulator 104 and an insulating layer 105. While one double-end-support beam is indicated in FIGS. 9(*a*) to 9(*c*), it will be obvious to those skilled in the art that a plurality of double-end-support beams may be provided in the same fashion.

In general, a spring constant of a double-end-support beam is 64 times as high as a cantilever of the same size. Each spring constant of the double-end-support beam and the cantilever is inversely proportional to the cube of the beam length. It is therefore possible to attain a double-end-support beam having a spring constant equivalent to that of a cantilever of the same size by making the beam length four times longer. In the present preferred embodiment, the beam is 0.01 mm wide and 0.4 mm long.

Figure 10:
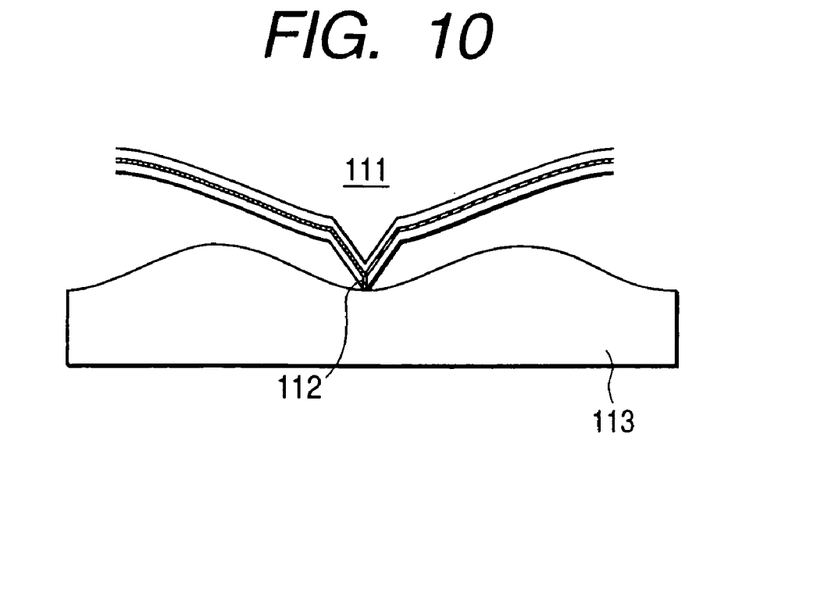
FIG. 10 is a conceptual scheme for explaining advantageous effects of the preferred embodiment of the lithographic scanning probe shown in FIG. 9.

In an application, the lithographic scanning probe of the present preferred embodiment is applicable in a lithography system such as is disclosed in Japanese Unexamined Patent Publication No. 11 (1999)-73906. As shown in FIG. 10, even if a lithographic scanning probe 111 undergoes significant displacement due to undulations on a surface to be patterned 113, the tip apex of a conductor 112 is kept in contact with the surface to be patterned 113.

EMBODIMENT VII

In the EMBODIMENT VII, there is provided a lithographic scanning probe having a conductive layer formed of a carbon nanotube material. The following describes the EMBODIMENT VII with particular reference to FIG. 11.

A carbon nanotube is a large carbon molecular structure having a tubular shape, which has been reported by S. Iijima in Nature 318 (1991), p. 56. The carbon nanotube has a conductive characteristic and can be easily formed into a shape having a uniform diameter of tens of nanometers or less and a length on the order of micrometers. Using a carbon nanotube material, a probe for atomic force microscopy having a carbon nanotube tip has been devised as reported by H. Dai et al. in Nature 384 (1996), pp. 147–150. Particularly useful for surface observation of a structure having a high aspect ratio, a carbon-nanotube-tip probe for atomic force microscopy is commercially available at present (sold for instance by PIEZOMAX Technologies Inc.).

Figure 11:
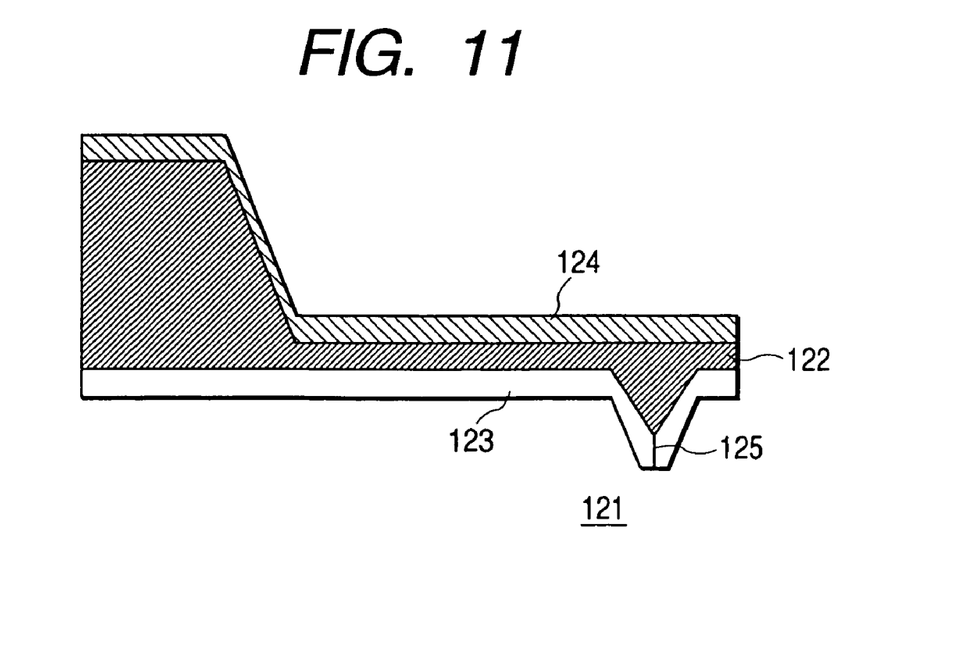
FIG. 11 is a schematic diagram showing a cross section of a lithographic scanning probe having a conductive layer formed of a carbon nanotube material according to the present invention.

Referring to FIG. 11, there is shown a schematic sectional view of the lithographic scanning probe having a conductive layer formed of a carbon nanotube material according to the present preferred embodiment. A lithographic scanning probe 121 of the present preferred embodiment has a three-layer structure comprising a conductor 122, a insulator 123, and a vending-correction layer 124 as in the EMBODIMENT I. The present preferred embodiment is characterized in that a carbon nanotube 125 is used at a tip apex part of the conductor 122 which comes into direct contact with a surface to be patterned. The carbon nanotube 125 can be formed into a conductive tip apex having a uniform diameter of tens of nanometers or less and a length on the order of micrometers, which would be unattainable in the prior art of microstructure fabrication. This arrangement makes it possible to draw a number of nanoscale patterns in succession.

Figure 12A:
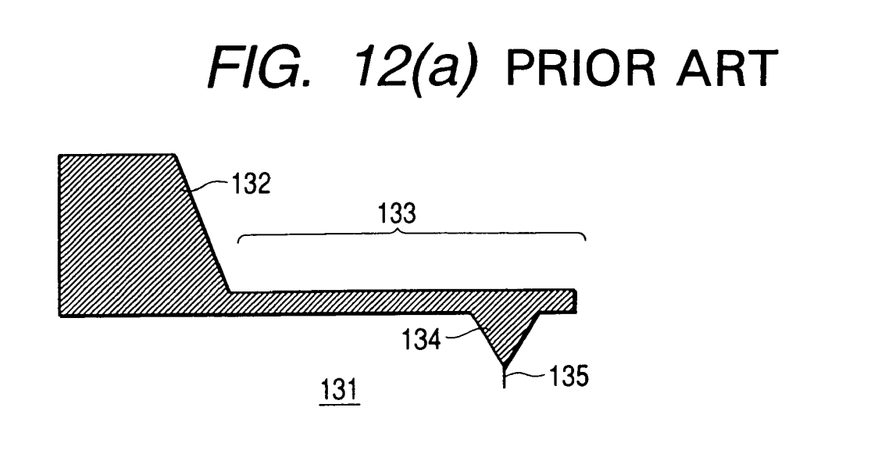
FIGS. 12(a) to 12(c) are schematic diagrams showing a procedure for making a lithographic scanning probe shown in FIG. 11.
Figure 12B:
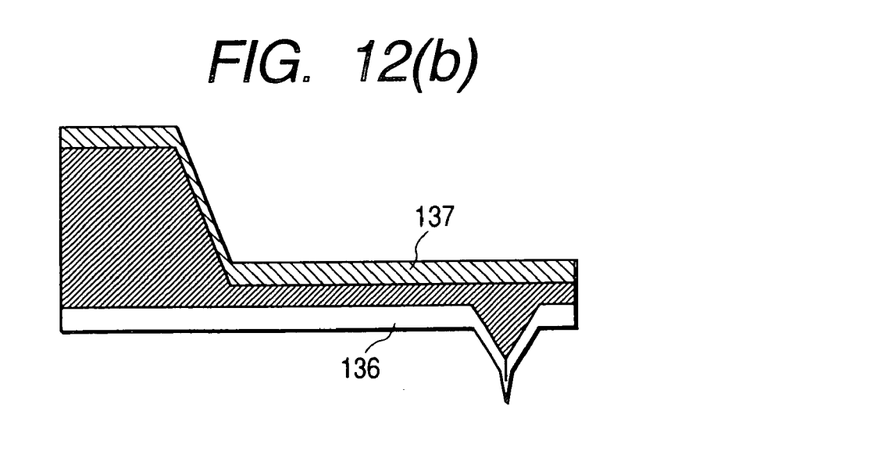
Figure 12C:
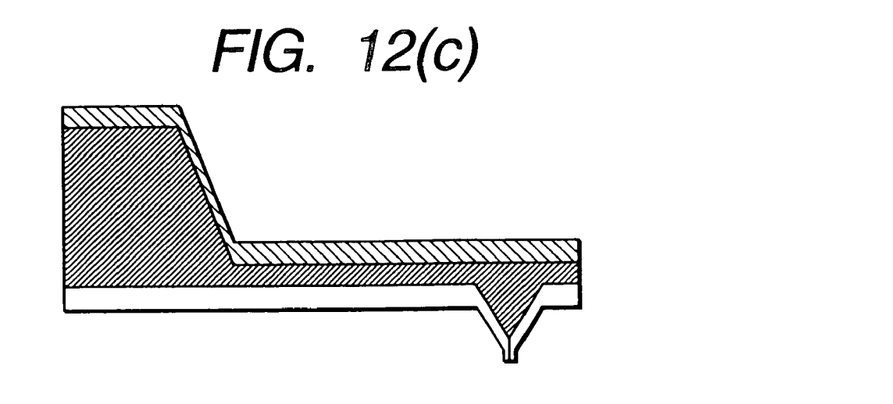

FIGS. 12(*a*) to 12(*c*) are schematic diagrams showing process steps of fabricating the lithographic scanning probe according to the present preferred embodiment.

Referring to FIG. 12(*a*), there is shown a schematic diagram of a commercial probe 131 having a carbon nanotube. The probe 131 comprises a holder 132, a spring section 133, a tip part 134, and a carbon nanotube 135 joined to the apex of the tip part 134. In the present preferred embodiment, an insulating layer 136 of silicon nitride is formed on the probing side of the probe 131, and a vending-correction layer 137 of silicon nitride is formed on the opposite side of the probing side (FIG. 12(*b*)). Thereafter, by scanning the probe on a diamond thin film under a load, the silicon nitride material at the apex of the carbon nanotube 135 is removed so that the apex of the carbon nanotube 135 is exposed. Thus, a lithographic scanning probe comprising a conductive tip apex which has a uniform diameter of tens of nanometers or less and which is protected with insulator on the periphery thereof can be fabricated (FIG. 12(*c*)).

As set forth hereinabove, the present invention makes it possible to draw a large number of fine patterns using a single probe for scanning probe lithography.

While the present invention has been described above in conjunction with the preferred embodiments, one skilled in the art would be enabled by this disclosure to make various modifications to these embodiments and still be within the scope and spirit of the invention as defined in the appended claims.

What is claimed is:

1. A probe for scanning probe lithography, comprising:
    a lever spring, at one end of which a supporting part is fabricated, and at the other end of which a tip part is fabricated;
    a conductive layer which is fabricated on one side of said lever spring and said tip part; and a conductive fine needle which is fabricated at the apex of said tip part and is surrounded by an insulator, wherein one end of said fine needle is connected to said conductive layer and the other end of said fine needle is not covered with said insulator;

wherein the cross-sectional diameter of said conductive fine needle is substantially uniform along the axial direction, and the cross-sectional diameter of said insulator surrounding said conductive fine needle increases in size in a direction extending away from said other end of said fine needle.

2. A probe for scanning probe lithography as claimed in claim 1,
wherein said tip part including said fine needle and said insulator is formed in a quadrangular pyramid shape having a flat apex.

3. A probe for scanning probe lithography as claimed in claim 1,
wherein said tip part including said fine needle and said insulator is formed in a hemispherical shape.

4. A probe for scanning probe lithography as claimed in claim 1,
wherein said shaft is made of a hard conductive material selected from the group consisting of titanium, tungsten, molybdenum, titanium carbide, tungsten carbide, molybdenum carbide, hydrogenated carbon, titanium nitride, tungsten nitride, molybdenum nitride, and carbon nanotube.

5. A probe for lithographic scanning probe as claimed in claim 1,
wherein said insulator is made of a hard insulating material selected from the group consisting of silicon dioxide, silicon nitride, and diamond.

6. A probe of scanning probe lithography as claimed in claim 1,
wherein said lever spring is formed to a double-end-support type, and at both ends of which supporting parts are fabricated, and at the center of which a tip part is fabricated.

7. A probe for scanning probe lithography as claimed in claim 1,
wherein said conductor is made of a hard conductive material selected from the group consisting of conductive diamond and chromium.

8. A probe for scanning probe lithography, comprising:
a lever spring, at one end of which a supporting part is fabricated, and at the other end of which a tip part is fabricated;
a conductive layer which is fabricated on one side of said lever spring and said tip part;
a bending-correction layer having a predetermined thickness on said conductive layer; and
a conductive fine needle which is fabricated at the apex of said tip part and is surrounded by an insulator, wherein one end of said fine needle is connected to said conductive layer and the other end of said fine needle is not covered with said insulator;
wherein the cross section of said fine needle has effectively the same diameter along the axial direction, and the cross section of said insulator increases in size in the direction of said lever spring,
wherein said probe is fabricated by the following steps of:
preparing a silicon substrate having a predetermined crystal orientation, and opening a predetermined hole therein;
forming an insulator layer having a predetermined thickness on said substrate;
opening, at the center of a hole shape arranged on said insulator layer, a pit having a predetermined configuration which extends from the surface of said insulator layer to said silicon substrate;
forming a conductive layer having a predetermined thickness on said insulator layer, and forming said conductive fine needle in said tip;
forming a vending-correction layer having a predetermined thickness on said conductive layer;
carrying out configuration processing of said lever spring which is formed of said silicon substrate, and which is formed of said insulator layer, said conductive layer, said vending-correction layer and said tip part;
forming said supporting part on said lever spring at the other end of the tip part; and
removing said silicon substrate from said lever spring.

9. A probe for scanning probe lithography, comprising:
a lever spring, at one end of which a supporting part is fabricated, and at other end of which a tip part is fabricated;
a conductive layer which is fabricated on one side of said lever spring and said tip part; and
a conductive fine needle which is fabricated at the apex of said tip part and is surrounded by an insulator, wherein one end of said fine needle is connected to said conductive layer and the other end of said fine needle is not covered with said insulator;
wherein the cross section of said fine needle has effectively the same diameter along the axial direction, and the cross section of said insulator increases in size towards the direction of said lever spring,
wherein said probe is fabricated by the following steps of:
preparing a silicon substrate having a predetermined crystal orientation, and opening a predetermined hole therein;
forming a conductive hydrogenated carbon film having a predetermined thickness on said substrate;
forming a hard-mask layer on the conductive carbon hydride film and removing the hard-mask layer except the center part of said hole portion, the diameter of which is approximately the same as the diameter of said fine needle;
irradiating an X-ray beam to the conductive carbon hydride film from above the substrate so that the conductive carbon hydride film is changed to an insulating diamond layer except said center part;
removing the hard-mask layer of the center part;
forming a conductive layer having a predetermined thickness on the insulating diamond layer and the conductive carbon hydride film of the center part;
carrying out configuration processing of said lever spring which is formed on said silicon substrate, and which is formed on said insulator, insulating diamond, said conductive layer, and said tip part;
forming said supporting part on said lever spring at the other end of the tip part; and
removing said silicon substrate from said lever spring.

10. A probe for scanning probe lithography, comprising:
a lever spring, at one end of which a supporting part is fabricated, and at the other end of which a tip part is fabricated;
a conductive layer which is fabricated on one side of said lever spring and said tip part; and a conductive fine thin plate which is fabricated at said tip part and is put between insulators, wherein one end of said fine thin plate is connected to said conductive layer and the other end of said thin plate is not covered with said insulator;

wherein the cross section of said thin plate has substantially the same width in the direction of said lever spring, and the cross section of said insulator increases in size towards the direction of said lever spring.

11. A probe for scanning probe lithography as claimed in claim 10, wherein a plurality of said conductive fine thin plates are fabricated and each of which is isolated by insulator layers and said conductive layer are also separated by insulator layers according to said conductive fine thin plates.

* * * * *